US010978414B2

(12) United States Patent
Kato et al.

(10) Patent No.: US 10,978,414 B2
(45) Date of Patent: Apr. 13, 2021

(54) SEMICONDUCTOR DEVICE AND METHOD OF MANUFACTURING A SEMICONDUCTOR DEVICE

(71) Applicant: ABLIC Inc., Chiba (JP)

(72) Inventors: Shinjiro Kato, Chiba (JP); Masaru Akino, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/794,443

(22) Filed: Feb. 19, 2020

(65) Prior Publication Data

US 2020/0185343 A1 Jun. 11, 2020

Related U.S. Application Data

(62) Division of application No. 15/918,405, filed on Mar. 12, 2018, now Pat. No. 10,607,954.

(30) Foreign Application Priority Data

Mar. 14, 2017 (JP) .............................. JP2017-048802

(51) Int. Cl.
H01L 23/31 (2006.01)
H01L 23/48 (2006.01)
(Continued)

(52) U.S. Cl.
CPC .......... *H01L 24/05* (2013.01); *H01L 23/3192* (2013.01); *H01L 24/03* (2013.01); *H01L 2224/0239* (2013.01); *H01L 2224/02123* (2013.01); *H01L 2224/02166* (2013.01); *H01L 2224/02206* (2013.01); *H01L 2224/02215* (2013.01); *H01L 2224/03011* (2013.01); *H01L 2224/03019* (2013.01); *H01L 2224/0391* (2013.01); *H01L 2224/03826* (2013.01); *H01L 2224/04042* (2013.01); *H01L 2224/05624* (2013.01); *H01L 2224/45139* (2013.01);
(Continued)

(58) Field of Classification Search
CPC .. H01L 23/3171; H01L 24/05; H01L 23/3192
See application file for complete search history.

(56) References Cited

U.S. PATENT DOCUMENTS

2008/0088023 A1* 4/2008 Oda
2010/0295044 A1 11/2010 Homma et al.
2017/0148701 A1* 5/2017 Ikoshi

FOREIGN PATENT DOCUMENTS

JP        5443827 B2    3/2014

* cited by examiner

Primary Examiner — Omar F Mojaddedi
(74) Attorney, Agent, or Firm — Brinks Gilson & Lione

(57) ABSTRACT

A semiconductor device includes a substrate, a wiring formed on the substrate, an anti-reflection film of titanium nitride formed on the wiring, and a silicon oxide film formed on the anti-reflection film. A pad portion which exposes the wiring is formed at a place where a first opening portion and a second opening portion overlap with each other. A metal nitride region containing fewer dangling bonds is formed from a metal nitride film containing fewer dangling bonds than in the anti-reflection film in at least a part of one or both of an opposed surface of the anti-reflection film which faces the silicon oxide film above the anti-reflection film, and an exposed surface of the anti-reflection film which is exposed in the second opening portion.

7 Claims, 7 Drawing Sheets

(51) Int. Cl.
  *H01L 21/02* (2006.01)
  *H01L 29/06* (2006.01)
  *H01L 23/528* (2006.01)
  *H01L 23/00* (2006.01)

(52) U.S. Cl.
  CPC ............... *H01L 2224/45144* (2013.01); *H01L 2224/45147* (2013.01); *H01L 2224/85205* (2013.01); *H01L 2224/85375* (2013.01); *H01L 2924/01013* (2013.01); *H01L 2924/01014* (2013.01); *H01L 2924/01022* (2013.01); *H01L 2924/01029* (2013.01); *H01L 2924/0132* (2013.01); *H01L 2924/0133* (2013.01); *H01L 2924/01042* (2013.01); *H01L 2924/01073* (2013.01); *H01L 2924/01074* (2013.01)

SEMICONDUCTOR DEVICE AND METHOD OF MANUFACTURING A SEMICONDUCTOR DEVICE

RELATED APPLICATIONS

This application is a divisional patent application of U.S. application Ser. No. 15/918,405, filed Mar. 12, 2018, which claims priority under 35 U.S.C. § 119 to Japanese Patent Application No. 2017-048802 filed on Mar. 14, 2017, the entire content of which is hereby incorporated by reference.
This application BACKGROUND OF THE INVENTION

1. Field of the Invention

The present invention relates to a semiconductor device and a method of manufacturing a semiconductor device.

2. Description of the Related Art

An existing semiconductor device includes a wiring made of aluminum or an aluminum alloy and formed on a substrate, an anti-reflection film made of titanium nitride and formed on the wiring, and an oxide film formed on the anti-reflection film, and a pad portion which exposes the wiring is formed at a place where an opening portion formed in the oxide film and an opening portion formed in the anti-reflection film overlap with each other in plan view.

In a semiconductor device having such a structure, titanium nitride which forms the anti-reflection film is sometimes corroded in a portion surrounding the opening portion by a long-term reliability test that involves bias application under a high-temperature and high-humidity environment, abbreviated as THB (Temperature Humidity Bias).

To solve this problem, a semiconductor device has been proposed in which titanium nitride forming the anti-reflection film is not exposed in the opening portion.

For example, in Japanese Patent No. 5443827, there is proposed a semiconductor device including: a first surface protection film with a first opening portion formed above a pad; and a second surface protection film formed on the pad and the first surface protection film to have a second opening portion above the pad, in which the pad includes a first conductor film and an anti-reflection film formed on the first conductor film, the second opening portion is contained in an inner region of the first opening portion, and the anti-reflection film is removed from the inner region of the first opening portion.

However, in the method described in Japanese Patent No. 5443827, it is required to perform a photolithography step twice to form the opening portion for exposing the pad, resulting in increase of the number of steps.

In addition, in a semiconductor device of the related art, particularly one in which a silicon oxide film is formed on an anti-reflection film made of titanium nitride, the anti-reflection film may change into titanium oxide due to the long-term reliability test (THB) that involves bias application under a high-temperature and high-humidity environment, resulting in a possible impairment of the external appearance of the anti-reflection film.

SUMMARY OF THE INVENTION

The present invention provides a semiconductor device in which titanium nitride forming an anti-reflection film is resistant to oxidation despite the presence of a silicon oxide film formed on the anti-reflection film made of titanium nitride, and an opening portion for exposing a pad portion can be formed by performing a photolithography step once, and also provides a method of manufacturing the semiconductor device.

Through extensive research, the inventors of the present invention have thought that a metal nitride region containing fewer dangling bonds than in the anti-reflection film should be formed in at least a part of one or both of an opposed surface between an oxide film formed on the anti-reflection film and the anti-reflection film, and an exposed surface of the anti-reflection film exposed in an opening portion, which leads to the present invention.

In the following a description "the metal nitride region containing fewer dangling bonds" is frequently used instead of "the metal nitride region containing fewer dangling bonds than in the anti-reflection film" to avoid redundancy.

Specifically, the present invention relates to the following items.

According to one embodiment of the present invention, there is provided a semiconductor device including:
a substrate;
a wiring formed on the substrate;
an anti-reflection film formed of titanium nitride on the wiring;
a silicon oxide film formed on the anti-reflection film;
a pad portion-exposing the wiring, and formed at a place where a first opening portion formed in the silicon oxide film and a second opening portion formed in the anti-reflection film overlap with each other in plan view; and
a metal nitride region containing fewer dangling bonds than in the anti-reflection film formed in at least a part of one or both of an opposed surface of the anti-reflection film facing the silicon oxide film above the anti-reflection film, and an exposed surface of the anti-reflection film being exposed in the second opening portion.

According to one embodiment of the present invention, there is provided a method of manufacturing a semiconductor device including:
forming a wiring on a substrate;
forming an anti-reflection film from titanium nitride on the wiring by reactive sputtering that uses argon gas and nitrogen gas;
forming a metal nitride film that contains fewer dangling bonds than in the anti-reflection film on the anti-reflection film by reactive sputtering in which a proportion of nitrogen gas to argon gas is set higher than a proportion of nitrogen gas to argon gas that is used when the anti-reflection film is formed;
forming a silicon oxide film on the metal nitride film containing fewer dangling bonds; and
forming an opening that penetrates the silicon oxide film, the metal nitride film containing fewer dangling bonds, and the anti-reflection film, and that exposes the wiring at a bottom of the opening.

According to one embodiment of the present invention, there is provided a method of manufacturing a semiconductor device including:
forming a wiring on a substrate;
forming an anti-reflection film from titanium nitride on the wiring;
forming a metal nitride film that contains fewer dangling bonds than in the anti-reflection film by performing a nitridation process on a surface of the anti-reflection film;
forming a silicon oxide film on the metal nitride film containing fewer dangling bonds; and forming an opening that penetrates the silicon oxide film, the metal nitride film containing fewer dangling bonds, and the anti-reflection film, and that exposes the wiring at a bottom of the opening.

According to one embodiment of the present invention, there is provided a method of manufacturing a semiconductor device including:

forming a wiring on a substrate;

forming an anti-reflection film from titanium nitride on the wiring;

forming a silicon oxide film on the anti-reflection film;

forming an opening that penetrates the silicon oxide film and the anti-reflection film, and exposes the wiring at a bottom of the opening; and forming a metal nitride region that contains fewer dangling bonds than in the anti-reflection film by performing a nitridation process on a portion of the anti-reflection film that is exposed in the opening.

According to the semiconductor device of the present invention, the metal nitride region containing fewer dangling bonds than in the anti-reflection film is formed in at least a part of one or both of the opposed surface of the anti-reflection film which faces the silicon oxide film above the anti-reflection film, and the exposed surface of the anti-reflection film which is exposed in the opening portion formed in the anti-reflection film. This makes titanium nitride forming the anti-reflection film resistant to oxidation, thereby giving the semiconductor device high reliability.

The semiconductor device of the present invention in which the opening portion for exposing the pad portion can be formed by performing a photolithography step once has excellent productivity as well.

DETAILED DESCRIPTION OF THE EMBODIMENTS

Figure 1:
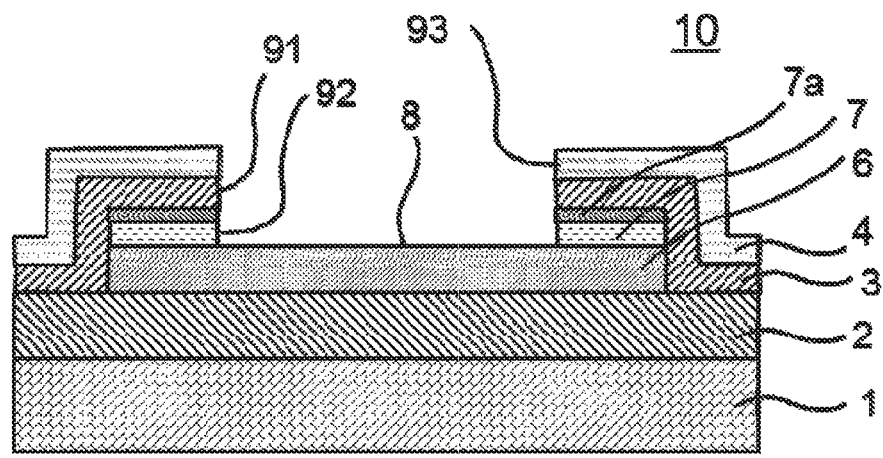
FIG. 1 is a schematic sectional view for illustrating an example of a semiconductor device according to the present invention.

The inventors of the present invention have acquired the following findings as a result of extensive research.

The inventors of the present invention have examined the corrosion of titanium nitride caused in a semiconductor device of the related art by a long-term reliability test (THB) that involves bias application under a high-temperature and high-humidity environment. As a result, it has been found that, when an anti-reflection film made of titanium nitride and a silicon oxide film are formed on a wiring in the stated order, and a pad portion which exposes the wiring is formed at a place where a first opening portion formed in the silicon oxide film and a second opening portion formed in the anti-reflection film overlap with each other in plan view, the oxidation of titanium nitride begins from the side of an opening portion (the second opening portion in Claims) of an opposed surface of the anti-reflection film which faces the silicon oxide film above the anti-reflection film.

Oxidation in the opposed surface of the anti-reflection film which faces the silicon oxide film above the anti-reflection film is inferred to be caused by reaction between titanium atoms in the anti-reflection film and moisture passing through the silicon oxide film. Oxidation in an exposed surface of the anti-reflection film which is exposed in the second opening portion is inferred to be caused by reaction between titanium atoms in the anti-reflection film and moisture infiltrating into the second opening portion.

In view of this, the inventors of the present invention have made a further study focused on dangling bonds of titanium atoms in the anti-reflection film. Titanium atoms in the surface of the anti-reflection film made of titanium nitride generally have dangling bonds that are not bonded to nitrogen. Dangling bonds of titanium atoms that are not bonded to nitrogen have high reactivity, and thus readily react with moisture passing through the oxide film, or moisture infiltrating into the second opening portion.

It is therefore inferred that an effective way to prevent the oxidation of the anti-reflection film made of titanium nitride is to reduce the number of dangling bonds of titanium atoms that are present in a readily oxidized surface of the anti-reflection film and that are not bonded to nitrogen.

The number of dangling bonds of titanium atoms that are not bonded to nitrogen can be reduced by, for example, performing a nitridation process on the readily oxidized surface of the anti-reflection film so that nitrogen atoms are bonded to dangling bonds of titanium atoms that are not bonded to nitrogen. The thus obtained surface of the anti-reflection film in which the number of dangling bonds of titanium atoms is reduced is a metal nitride region containing fewer dangling bonds than in the anti-reflection film.

Another way that is inferred to be effective for the prevention of the oxidation of the anti-reflection film made of titanium nitride is to provide a metal nitride region containing fewer dangling bonds than in the anti-reflection film on the readily oxidized surface of the anti-reflection film. In this case, it is surmised that the metal nitride region containing fewer dangling bonds hinders reaction between titanium atoms in the titanium nitride that are not bonded to nitrogen and moisture that infiltrates from the opening portion and passes through the silicon oxide film formed on the anti-reflection film, or moisture that infiltrates into the second opening portion.

The metal nitride region containing fewer dangling bonds, can be formed of, for example, a nitride obtained by reactive sputtering in which the proportion of nitrogen gas to argon gas is set high. Specific examples of a nitride that can be formed by reactive sputtering with the proportion of nitrogen gas to argon gas set higher than normal include titanium nitride, tantalum nitride, molybdenum nitride, and tungsten nitride.

The inventors of the present invention have thus found that the oxidation of titanium nitride can be prevented by forming a metal nitride region that contains fewer dangling bonds than in the anti-reflection film in at least a part of one or both of the opposed surface of the anti-reflection film which faces the silicon oxide film above the anti-reflection film, and the exposed surface of the anti-reflection film which is exposed in the second opening portion, to thereby lower the chance of reaction between dangling bonds of titanium atoms in the anti-reflection film that are not bonded to nitrogen and moisture passing through the silicon oxide film, or moisture infiltrating into the second opening portion, and the inventors of the present invention consequently have thought of the present invention.

The present invention is described in detail below with reference to the drawings. Some of the drawings referred to in the following description are enlarged views of characteristic portions which are enlarged for convenience of making the characteristics of the present invention understood easier, and the ratios of the dimensions of components to one another and the like may differ from actuality. The materials, dimensions, and the like given in the following description are an example, and the present invention is not limited thereto. The present invention can be carried out in suitably varied modes without losing the effects of the present invention.

<First Embodiment>
[Semiconductor Device]

FIG. 1 is a schematic sectional view for illustrating an example of a semiconductor device according to the present invention.

A semiconductor device 10 according to a first embodiment of the present invention includes a substrate 1, a wiring 6 formed on the substrate 1 with an interlayer insulating film 2 interposed between the substrate 1 and the wiring 6, an anti-reflection film 7 formed on the wiring 6, a silicon oxide film 3 formed above the anti-reflection film 7, and a protection film 4 formed on the silicon oxide film 3.

In the semiconductor device 10 according to the first embodiment, a pad portion 8 which exposes the wiring 6 is formed at a place where a first opening portion 91 which is formed in the silicon oxide film 3, a second opening portion 92 which is formed in the anti-reflection film 7, and a third opening portion 93 which is formed in the protection film 4, overlap with one another in plan view as illustrated in FIG. 1.

In the semiconductor device 10 of FIG. 1, a metal nitride region 7a containing fewer dangling bonds than in the anti-reflection film 7 is formed on the entire opposed surface of the anti-reflection film 7 which faces the silicon oxide film 3 above the anti-reflection film 7.

A substrate made of silicon or other known materials can be used as the substrate 1.

The interlayer insulating film 2 can be a known insulating film, for example, a $SiO_2$ film, or an oxide film having tetraethyl orthosilicate (TEOS) ($Si(OC_2H_5)_4$) as a raw material.

The silicon oxide film 3 is formed so as to cover the wiring 6 on which the anti-reflection film 7 and the metal nitride region 7a containing fewer dangling bonds, are formed.

Specific examples of a film that can be used as the silicon oxide film 3 include a $SiO_2$ film and an oxide film having TEOS as a raw material.

A preferred thickness of the silicon oxide film 3 is from 2,000 Å to 8,000 Å, and a thickness of about 5,000 Å is even more preferred.

The protection film 4 can be a silicon nitride film, a silicon oxynitride film, or a similar film, and a silicon nitride film is preferred as the protection film 4. In the semiconductor device 10 of FIG. 1, the silicon oxide film 3 is provided between the protection film 4 and the anti-reflection film 7, and hence stress between the protection film 4 and the anti-reflection film 7 can be lessened compared to the case in which the protection film 4 and the anti-reflection film 7 are in contact with each other. As a result, in the semiconductor device 10 of FIG. 1, fine adhesion between the anti-reflection film 7 and the silicon oxide film 3 and between the silicon oxide film 3 and the protection film 4 is favorably achieved.

A preferred thickness of the protection film 4 is from 5,000 Å to 15,000 Å, and a thickness of about 10,000 Å is preferred even more.

The wiring 6 is made of aluminum or an aluminum alloy. Examples of the aluminum alloy used include an alloy of aluminum, silicon, and copper, an alloy of aluminum and copper, and an alloy of aluminum and silicon.

A preferred thickness of the wiring 6 is from 3,000 Å to 30,000 Å, and a thickness of about 5,000 Å is even more preferred.

The anti-reflection film 7 also functions as a wiring. The anti-reflection film 7 is made of titanium nitride.

A preferred thickness of the anti-reflection film 7 is from 250 Å to 800 Å, and a thickness of about 400 Å is even more preferred.

The metal nitride region 7a containing fewer dangling bonds also functions as a wiring along with the wiring 6 and the anti-reflection film 7. The metal nitride region 7a containing fewer dangling bonds may be formed from a single layer of a metal nitride film or a layered film including a plurality of layers of metal nitride films.

Examples of a metal nitride forming the metal nitride region 7a containing fewer dangling bonds include a titanium nitride, a tantalum nitride, a molybdenum nitride, and a tungsten nitride that are formed by a method described later. Titanium nitride can easily be formed by the method described later, and is accordingly preferred as a metal nitride forming the metal nitride region 7a containing fewer dangling bonds.

[Method of Manufacturing Semiconductor Device]
(First Manufacturing Method)

A method of manufacturing a semiconductor device according to the present invention is described next by taking as an example a method of manufacturing the semiconductor device of FIG. 1. FIG. 2 to FIG. 6 are process views for illustrating an example of the method of manufacturing the semiconductor device of FIG. 1.

To manufacture the semiconductor device 10 illustrated in FIG. 1, a laminate 5 which includes the interlayer insulating film 2, the wiring 6, the anti-reflection film 7, and a metal nitride film 71, is first formed on one of the principal surfaces of the substrate 1.

Figure 2:
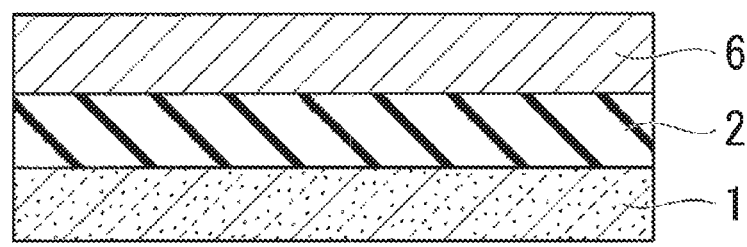
FIG. 2 is a process view for illustrating an example of a method of manufacturing the semiconductor device of FIG. 1.

Specifically, the interlayer insulating film 2 is formed on the substrate 1 as illustrated in FIG. 2 by CVD or other methods. The wiring 6 is then formed on the interlayer insulating film 2 by sputtering or other methods (a wiring step).

Figure 3:
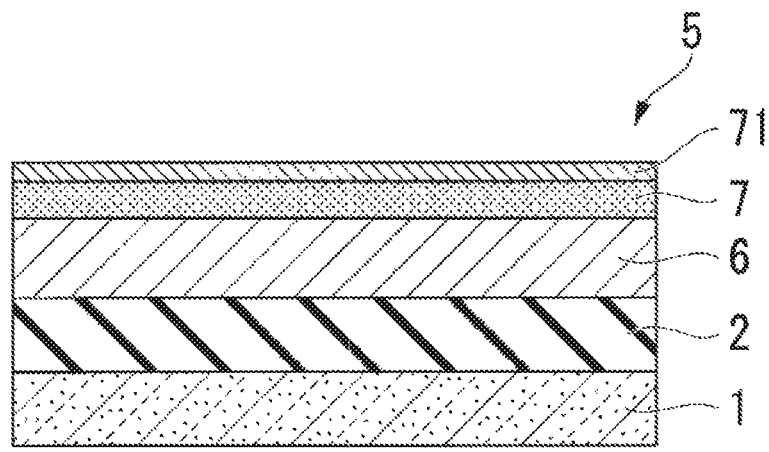
FIG. 3 is a process view for illustrating the example of the method of manufacturing the semiconductor device of FIG. 1.

The anti-reflection film 7 is formed next from titanium nitride on the wiring 6 as illustrated in FIG. 3 by reactive sputtering that uses argon gas (Ar) and nitrogen gas ($N_2$) (an anti-reflection film forming step).

The proportion of nitrogen gas to argon gas ($Ar:N_2$) to form the anti-reflection film 7 is, for example, from 1:2 to 1:5 in flow ratio, and about 3:7 is preferred. When the proportion of nitrogen ($Ar:N_2$) is equal to or higher than 1:2, titanium nitride forming the anti-reflection film 7 does not contain too many dangling bonds that are not bonded to nitrogen. When the proportion of nitrogen ($Ar:N_2$) is equal to or lower than 1:5, the anti-reflection film 7 can be formed at a satisfactorily high film forming speed which gives the semiconductor device 10 excellent productivity.

Next, the metal nitride film 71 is formed on the anti-reflection film 7 by reactive sputtering in which the proportion of nitrogen gas to argon gas is set higher than the proportion used when the anti-reflection film 7 is formed (a step of forming a metal nitride film that contains fewer dangling bonds). The metal nitride film 71 containing fewer dangling bonds than dangling bonds of titanium atoms in the anti-reflection film 7 is obtained by setting the proportion of nitrogen gas to argon gas higher than the proportion used when the anti-reflection film 7 is formed.

In the step of forming a metal nitride film that contains fewer dangling bonds, it is preferred to form a titanium nitride film as the metal nitride film 71 by reactive sputtering that uses a target containing titanium. With this, it is possible to successively form the anti-reflection film 7 and the metal nitride film 71 with the use of the target used to form the anti-reflection film 7, which facilitates the forming of the metal nitride film 71.

The proportion of nitrogen gas to argon gas ($Ar:N_2$) to form a titanium nitride film as the metal nitride film 71 is, for example, from 1:8 to 1:10 in flow ratio, and about 1:9 is preferred. When the proportion of nitrogen ($Ar:N_2$) is equal to or higher than 1:8, it is easy to obtain a titanium nitride film containing fewer dangling bonds of titanium atoms that are not bonded to nitrogen. When the proportion of nitrogen ($Ar:N_2$) is equal to or lower than 1:10, the metal nitride film 71 can be formed at a satisfactorily high film forming speed, which gives the semiconductor device 10 an excellent productivity.

In the step of forming a metal nitride film that contains fewer dangling bonds, a target containing one type of metal that is selected from the group consisting of tantalum, molybdenum, and tungsten may be used in place of a target containing titanium. In this case, one type of metal nitride film that is selected from the group consisting of a tantalum nitride film, a molybdenum nitride film, and a tungsten nitride film can be formed as the metal nitride film 71.

The proportion of nitrogen gas to argon gas ($Ar:N_2$) to form one of the metal nitride films given above as the metal nitride film 71 is, for example, from 1:8 to 1:10 in flow ratio, and about 1:9 is preferred. When the proportion of nitrogen ($Ar:N_2$) is equal to or higher than 1:8, it is easy to obtain a metal nitride film containing fewer dangling bonds of metal atoms that are not bonded to nitrogen. When the proportion of nitrogen ($Ar:N_2$) is equal to or lower than 1:10, the metal nitride film 71 can be formed at a satisfactorily high film forming speed, which gives the semiconductor device 10 an excellent productivity.

Figure 4:
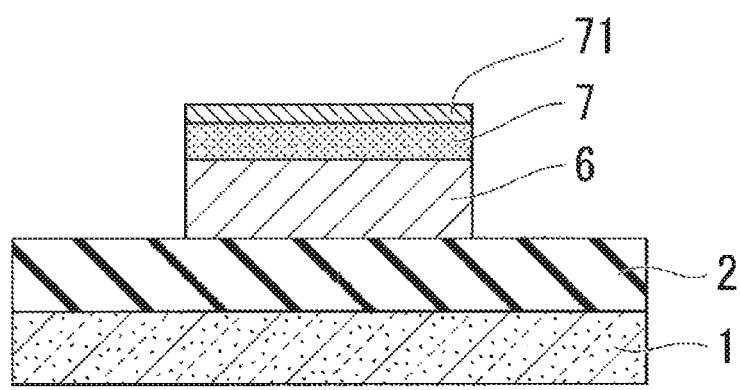
FIG. 4 is a process view for illustrating the example of the method of manufacturing the semiconductor device of FIG. 1.

Next, the wiring 6, the anti-reflection film 7, and the metal nitride film 71 are patterned into a given shape as illustrated in FIG. 4 with the use of a known photolithography method and a known etching method. In the example illustrated in FIG. 1, a wiring layer which includes the wiring 6, the anti-reflection film 7, and the metal nitride film 71, is formed by patterning the wiring 6, the anti-reflection film 7, and the metal nitride film 71 into the same shape.

Figure 5:
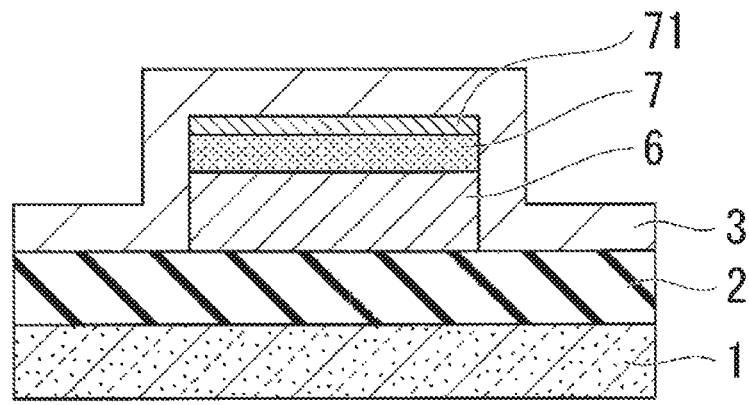
FIG. 5 is a process view for illustrating the example of the method of manufacturing the semiconductor device of FIG. 1.

The silicon oxide film 3 is formed next on the wiring layer which includes the wiring 6, the anti-reflection film 7, and the metal nitride film 71, so as to cover the wiring layer as illustrated in FIG. 5 by plasma CVD or other methods (an oxide film forming step).

Figure 6:
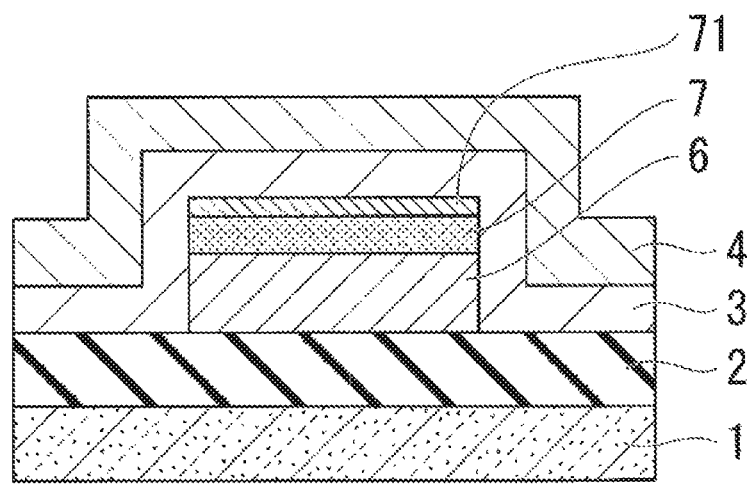
FIG. 6 is a process view for illustrating the example of the method of manufacturing the semiconductor device of FIG. 1.

The protection film 4 is formed next on the silicon oxide film 3 as illustrated in FIG. 6 by plasma CVD or other methods (a protection film forming step).

Next, a known photolithography method and a known etching method are used to form an opening that penetrates the protection film 4, the silicon oxide film 3, the metal nitride film 71, and the anti-reflection film 7, and exposes the wiring 6 at the bottom (an opening portion forming step). This forms the pad portion 8 which exposes the wiring 6, at a place where the first opening portion 91 which is formed in the silicon oxide film 3, the second opening portion 92 which is formed in the anti-reflection film 7, and the third opening portion 93 which is formed in the protection film 4, overlap with one another in plan view as illustrated in FIG. 1.

Through the steps described above, the semiconductor device 10 illustrated in FIG. 1 is obtained.

The method of manufacturing the semiconductor device 10 according to the first embodiment includes, after the anti-reflection film forming step and before the oxide film forming step, a step of forming on the anti-reflection film 7 the metal nitride film 71 which contains fewer dangling bonds than in the anti-reflection film 7 by reactive sputtering in which the proportion of nitrogen gas to argon gas is set higher than the proportion used when the anti-reflection film 7 is formed. The semiconductor device 10 of FIG. 1 in which the metal nitride region 7a containing fewer dangling bonds is formed from the metal nitride film 71 containing fewer dangling bonds than in the anti-reflection film 7 over the entire opposed surface of the anti-reflection film 7 which faces the silicon oxide film 3 above the anti-reflection film 7 is accordingly obtained by executing the oxide film forming step and the opening portion forming step in the stated order after the step of forming the metal nitride film 71 containing fewer dangling bonds.

In addition, since the method of manufacturing the semiconductor device 10 according to the first embodiment does not require an exposure step for forming the metal nitride region 7a containing fewer dangling bonds, the metal nitride region 7a containing fewer dangling bonds is formed efficiently and consequently gives the manufacturing method excellent productivity.

(Second Manufacturing Method)

The method of manufacturing the semiconductor device 10 of FIG. 1 is not limited to the first manufacturing method described above, and the semiconductor device 10 of FIG. 1 may be manufactured by, for example, a second manufacturing method described below.

Figure 7:
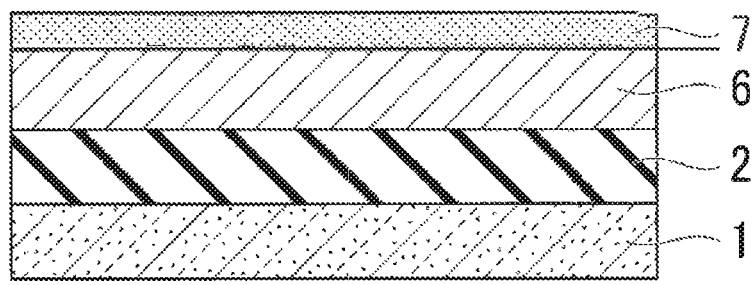
FIG. 7 is a process view for illustrating another example of the method of manufacturing the semiconductor device of FIG. 1.
Figure 8:
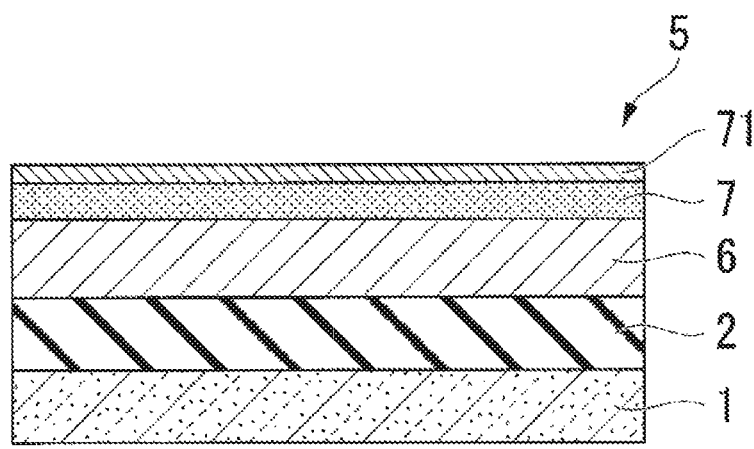
FIG. 8 is a process view for illustrating the other example of the method of manufacturing the semiconductor device of FIG. 1.

FIG. 7 and FIG. 8 are process views for illustrating another example of the method of manufacturing the semiconductor device of FIG. 1.

The second manufacturing method described below differs from the first manufacturing method in the step of forming a metal nitride film that contains fewer dangling bonds. Specifically, steps up through the step of forming the anti-reflection film 7 on the wiring 6 (the anti-reflection film forming step) are carried out as illustrated in FIG. 7 in the second manufacturing method as in the first manufacturing method. Then, before the oxide film forming step, a titanium nitride film is formed on a surface of the anti-reflection film 7 as the metal nitride film 71 containing fewer dangling bonds as illustrated in FIG. 8 by a nitridation process (the step of forming a metal nitride film that contains fewer dangling bonds).

The nitridation process in the step of forming a metal nitride film that contains fewer dangling bonds is preferred to be heat treatment in a nitrogen-containing gas atmosphere, or plasma treatment that uses a nitrogen-containing gas. A preferred nitrogen-containing gas to be used in the nitridation process is nitrogen gas and/or ammonium gas, and nitrogen gas is particularly preferred.

Heat treatment in which the sample is held in a nitrogen-containing gas atmosphere at a temperature from 350° C. to 650° C. for about one minute (rapid thermal annealing: RTA) is an example of the heat treatment in a nitrogen-containing gas atmosphere.

Treatment performed in a nitrogen-containing gas atmosphere with the use of a plasma etching device is an example of the plasma treatment.

The second manufacturing method described above includes, after the anti-reflection film forming step and before the oxide film forming step, a step of forming a metal nitride film that contains fewer dangling bonds by performing a nitridation process on the surface of the anti-reflection film 7. The semiconductor device 10 of FIG. 1 in which the metal nitride region 7a containing fewer dangling bonds is formed over the entire opposed surface of the anti-reflection film 7 which faces the silicon oxide film 3 above the anti-reflection film 7 is accordingly obtained by executing the oxide film forming step and the opening portion forming step in the stated order after the step of forming a metal nitride film that contains fewer dangling bonds.

In addition, since the second manufacturing method does not require an exposure step for forming the metal nitride region 7a containing fewer dangling bonds, the metal nitride region 7a containing fewer dangling bonds is formed efficiently and consequently gives the second manufacturing method an excellent productivity.

The step of forming a metal nitride film that contains fewer dangling bonds in the second manufacturing method may be executed, if necessary, after the step of forming a metal nitride film that contains fewer dangling bonds in the first manufacturing method, before the oxide film forming step.

In this case, a layered film that includes a film formed by the first manufacturing method and a film formed by the second manufacturing method is formed as the metal nitride film 71 on the anti-reflection film 7.

<Second Embodiment>
[Semiconductor Device]

Figure 9:
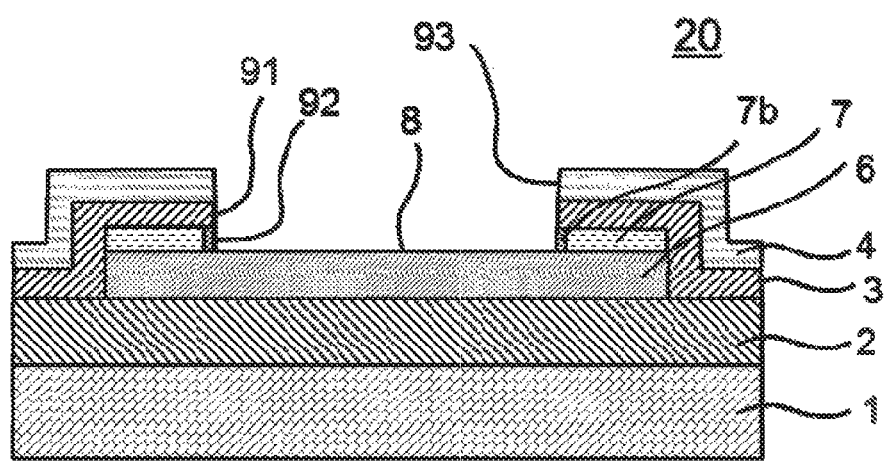
FIG. 9 is a schematic sectional view for illustrating another example of the semiconductor device according to the present invention.

FIG. 9 is a schematic sectional view for illustrating another example of the semiconductor device according to the present invention.

A semiconductor device 20 according to a second embodiment of the present invention which is illustrated in FIG. 9 differs from the semiconductor device 10 according to the first embodiment only in the location where the metal nitride region containing fewer dangling bonds is formed. Descriptions on the same members as those in the semiconductor device 10 according to the first embodiment are therefore omitted in the second embodiment.

In the semiconductor device 10 of FIG. 1, the metal nitride region 7a containing fewer dangling bonds is formed on the entire opposed surface of the anti-reflection film 7 which faces the silicon oxide film 3 above the anti-reflection film 7. In the semiconductor device 20 of FIG. 9, a metal nitride region 7b containing fewer dangling bonds is formed on the entire exposed surface of the anti-reflection film 7 which is exposed in the second opening portion 92.

The metal nitride region 7b containing fewer dangling bonds can be formed of any metal nitride that contains fewer dangling bonds than in the anti-reflection film 7, for example, a titanium nitride that is formed by a method described later.

[Method of Manufacturing Semiconductor Device]

A method of manufacturing the semiconductor device of FIG. 9 is described next through an example. FIG. 10 to FIG. 13 are process views for illustrating an example of the method of manufacturing the semiconductor device of FIG. 9.

To manufacture the semiconductor device 20 of FIG. 9, steps up through the anti-reflection film forming step are executed first as when the semiconductor device 10 of FIG. 1 is manufactured.

Figure 10:
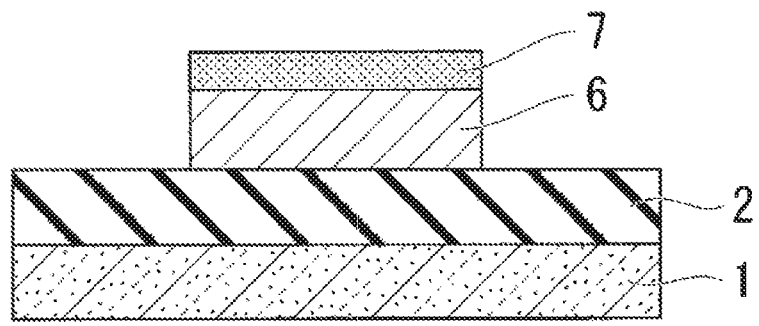
FIG. 10 is a process view for illustrating an example of a method of manufacturing the semiconductor device of FIG. 9.

Next, a known photolithography method and a known etching method are used to pattern the wiring 6 and the anti-reflection film 7 into a given shape as illustrated in FIG. 10. In the example illustrated in FIG. 9, a wiring layer including the wiring 6 and the anti-reflection film 7 is formed by patterning the wiring 6 and the anti-reflection film 7 into the same shape.

Figure 11:
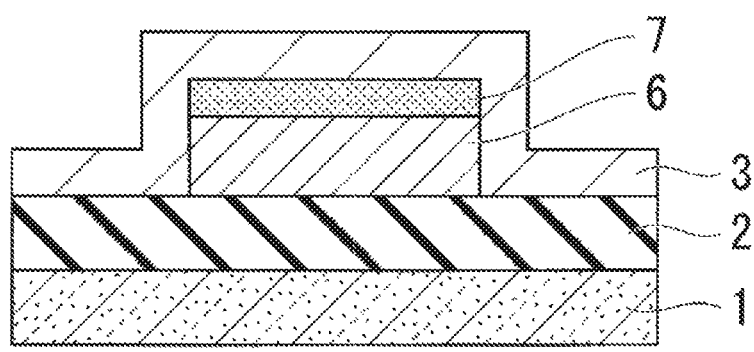
FIG. 11 is a process view for illustrating the example of the method of manufacturing the semiconductor device of FIG. 9.

The silicon oxide film 3 is formed next on the wiring layer including the wiring 6 and the anti-reflection film 7 so as to cover the wiring layer as illustrated in FIG. 11 by plasma CVD or other methods (an oxide film forming step).

Figure 12:
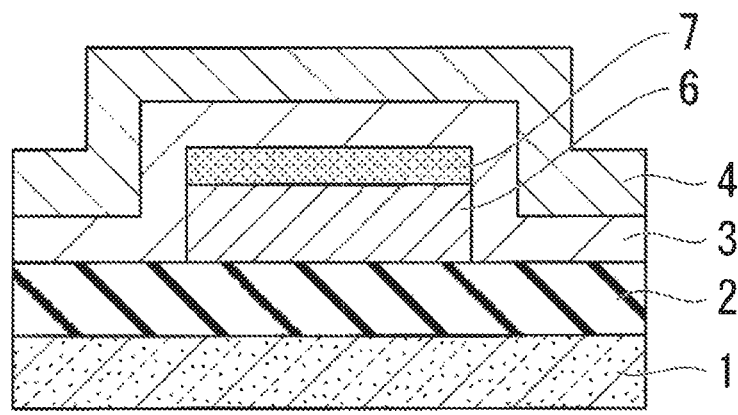
FIG. 12 is a process view for illustrating the example of the method of manufacturing the semiconductor device of FIG. 9.

The protection film 4 is formed next on the silicon oxide film 3 as illustrated in FIG. 12 by plasma CVD or other methods (a protection film forming step).

Figure 13:
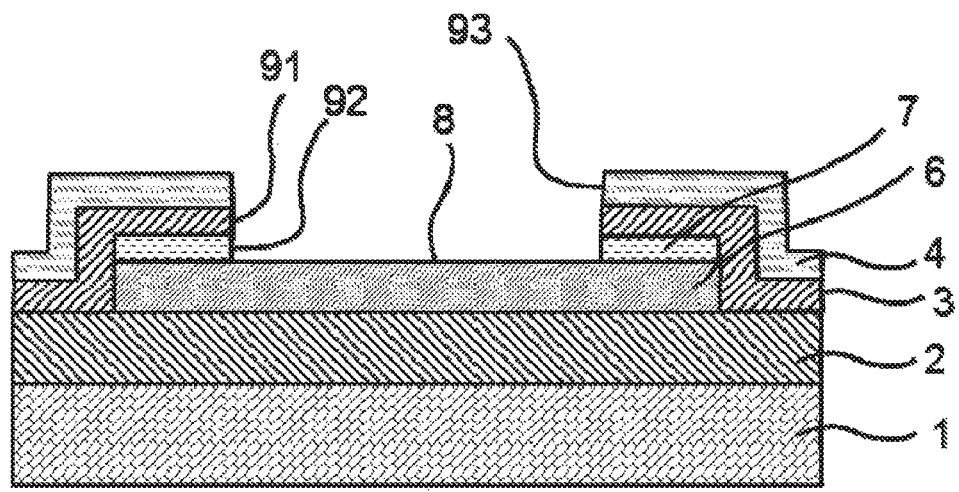
FIG. 13 is a process view for illustrating the example of the method of manufacturing the semiconductor device of FIG. 9.

Photolithography and etching are used next to form an opening that penetrates the protection film 4, the silicon oxide film 3, and the anti-reflection film 7, and exposes the wiring 6 at the bottom (in the example of FIG. 13, the first opening portion 91, the second opening portion 92, and the third opening portion 93), as illustrated in FIG. 13 (an opening portion forming step). This forms the pad portion 8 which exposes the wiring 6, at a place where the first opening portion 91 which is formed in the silicon oxide film 3, the second opening portion 92 which is formed in the anti-reflection film 7, and the third opening portion 93 which is formed in the protection film 4, overlap with one another in plan view as illustrated in FIG. 13.

A nitridation process is performed next on a portion of the anti-reflection film 7 that is exposed in the second opening portion 92, which is a step of forming a metal nitride region that contains fewer dangling bonds. The exposed surface of the anti-reflection film 7 which is exposed in the second opening portion 92 is thus turned into the metal nitride region 7b containing fewer dangling bonds than in the anti-reflection film 7.

The nitridation process in the step of forming a metal nitride region that contains fewer dangling bonds can be performed in the same way as when the nitridation process is performed in the manufacturing steps of the semiconductor device 10 of FIG. 1.

Through the steps described above, the semiconductor device 20 illustrated in FIG. 9 is obtained.

The method of manufacturing the semiconductor device 20 according to the second embodiment includes a step of forming a metal nitride region that contains fewer dangling bonds by performing a nitridation process on a portion of the anti-reflection film 7 that is exposed in the second opening portion 92 after the opening portion forming step. The semiconductor device 20 of FIG. 9 in which the metal nitride region 7b containing fewer dangling bonds is formed from a metal nitride film containing fewer dangling bonds than in the anti-reflection film 7 over the entire exposed surface that is exposed in the second opening portion 92 is accordingly obtained after the step of forming a nitride region that contains fewer dangling bonds.

In addition, since the method of manufacturing the semiconductor device 20 according to the second embodiment does not require an exposure step for forming the metal nitride region 7b containing fewer dangling bonds, the metal nitride region 7b containing fewer dangling bonds is formed efficiently and consequently gives the manufacturing method an excellent productivity.

<Third Embodiment>

[Semiconductor Device]

Figure 14:
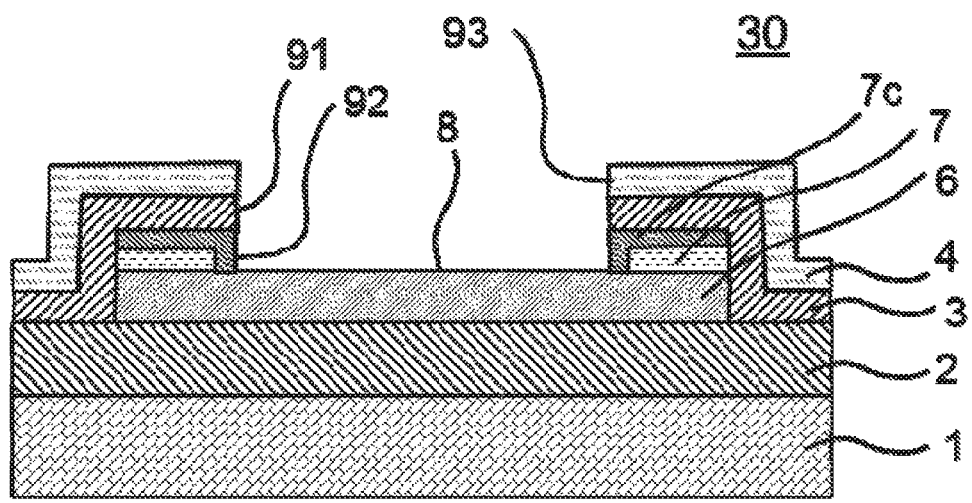
FIG. 14 is a schematic sectional view for illustrating still another example of the semiconductor device according to the present invention.

FIG. 14 is a schematic sectional view for illustrating still another example of the semiconductor device according to the present invention.

A semiconductor device 30 according to a third embodiment of the present invention which is illustrated in FIG. 14 differs from the semiconductor device 10 according to the first embodiment only in the location where the metal nitride region containing fewer dangling bonds is formed. Descriptions on the same members as those in the semiconductor device 10 according to the first embodiment are therefore omitted in the third embodiment.

In the semiconductor device 10 of FIG. 1, the metal nitride region 7a containing fewer dangling bonds is formed on the entire opposed surface of the anti-reflection film 7 which faces the silicon oxide film 3 above the anti-reflection film 7. In the semiconductor device 30 of FIG. 14, a metal nitride region 7c containing fewer dangling bonds is formed on the entire exposed surface of the anti-reflection film 7 which is exposed in the second opening portion 92, in addition to the entire opposed surface of the anti-reflection film 7 which faces the silicon oxide film 3 above the anti-reflection film 7.

The metal nitride region 7c containing fewer dangling bonds may be formed from a metal nitride film of one type or from metal nitride films of a plurality of types. The metal nitride region 7c containing fewer dangling bonds that is formed from metal nitride films of a plurality of types includes, for example, different metal nitride films used to form the opposed surface of the anti-reflection film 7 which faces the silicon oxide film 3 above the anti-reflection film 7, and the exposed surface of the anti-reflection film 7 which is exposed in the second opening portion 92.

Of the metal nitride region 7c containing fewer dangling bonds, a metal nitride that forms the opposed surface of the anti-reflection film 7 which faces the silicon oxide film 3 above the anti-reflection film 7, can be the same metal nitride that forms the metal nitride region 7a containing fewer dangling bonds in the semiconductor device 10 according to the first embodiment.

Of the metal nitride region 7c containing fewer dangling bonds, a metal nitride that forms the exposed surface of the anti-reflection film 7 which is exposed in the second opening portion 92, can be the same metal nitride that forms the metal nitride region 7b containing fewer dangling bonds in the semiconductor device 20 according to the second embodiment.

[Method of Manufacturing Semiconductor Device]

A method of manufacturing the semiconductor device of FIG. 14 is described next through an example. To manufacture the semiconductor device 30 of FIG. 14, the semiconductor device 10 according to the first embodiment which is illustrated in FIG. 1 is manufactured first by one of the first manufacturing method and the second manufacturing method which are described above.

The next step is to form a metal nitride region that contains fewer dangling bonds in the semiconductor device 10 according to the first embodiment which is illustrated in FIG. 1. This step is the same as the step of forming a metal nitride region that contains fewer dangling bonds in the manufacture of the semiconductor device 20 according to the second embodiment. The opposed surface of the anti-reflection film 7 which faces the silicon oxide film 3 above the anti-reflection film 7, and the exposed surface of the anti-reflection film 7 which is exposed in the second opening portion 92, are thus turned into the metal nitride region 7c containing fewer dangling bonds and formed from a metal nitride film containing fewer dangling bonds than in the anti-reflection film 7 as illustrated in FIG. 14.

Through the steps described above, the semiconductor device 30 illustrated in FIG. 14 is obtained.

The method of manufacturing the semiconductor device 30 according to the third embodiment includes a step of forming a metal nitride region that contains fewer dangling bonds by performing a nitridation process on a portion of the anti-reflection film 7 that is exposed in the opening of the semiconductor device 10 according to the first embodiment. The semiconductor device 30 of FIG. 14 is accordingly obtained in which the metal nitride region 7c containing fewer dangling bonds is formed from a metal nitride film containing fewer dangling bonds than in the anti-reflection film 7 on the entire opposed surface of the anti-reflection film 7 which faces the silicon oxide film 3 above the anti-reflection film 7, and the entire exposed surface of the anti-reflection film 7 which is exposed in the second opening portion 92.

In addition, since the method of manufacturing the semiconductor device 30 according to the third embodiment does not require an exposure step for forming the metal nitride region 7c containing fewer dangling bonds, the metal nitride region 7c containing fewer dangling bonds is formed efficiently and consequently gives the manufacturing method an excellent productivity.

The semiconductor device according to the present invention is not limited to the semiconductor devices described above, namely, the semiconductor device 10 according to the first embodiment, the semiconductor device 20 according to the second embodiment, and the semiconductor device 30 according to the third embodiment. For instance, the metal nitride region containing fewer dangling bonds only needs to be formed in at least a part of one or both of the opposed surface of the anti-reflection film 7 which faces the silicon oxide film 3 above the anti-reflection film, and the exposed surface of the anti-reflection film 7 which is exposed in the second opening portion 92.

The descriptions given above on the semiconductor device 10 according to the first embodiment and the semiconductor device 30 according to the third embodiment take as an example a case in which a single wiring layer including the wiring 6, the anti-reflection film 7, and the metal nitride region containing fewer dangling bonds is included (the single wiring layer in the second embodiment includes the wiring 6 and the anti-reflection film 7). However, one or more wiring layers containing a known material may be included in addition to the wiring layer described above. When the semiconductor device according to the present invention includes a plurality of wiring layers, it is preferred that the wiring layer including the wiring 6, the anti-reflection film 7, and the metal nitride region containing fewer dangling bonds (in the second embodiment, the wiring layer including the wiring 6 and the anti-reflection film 7) be the topmost wiring layer.

The semiconductor device according to the present invention may further include layers having various functions to suit its use.

EXAMPLE

Now, effects of the present invention are further clarified from the description of examples of the present invention. The present invention is not limited to the following examples, and modifications can be made thereto as appropriate within the range not changing the gist of the present invention.

Example 1

A semiconductor device of Example 1 illustrated in FIG. 1 was obtained by a manufacturing method described below.

First, the interlayer insulating film 2 was formed from a $SiO_2$ film on the substrate 1 made of silicon as illustrated in FIG. 2 by CVD. The wiring 6 made of an alloy of aluminum, silicon, and copper and having a thickness of 5,000 Å was then formed on the interlayer insulating film 2 by sputtering (the wiring step).

The anti-reflection film 7 made of titanium nitride and having a thickness of 400 Å was formed next on the wiring 6 as illustrated in FIG. 3 by reactive sputtering that used a target containing titanium and argon gas (Ar) and nitrogen gas ($N_2$) (the anti-reflection film forming step). The proportion of nitrogen gas to argon gas ($Ar:N_2$) to form the anti-reflection film 7 was set to 3:7 in volume ratio.

The metal nitride film 71 was formed next from a titanium nitride film on the anti-reflection film 7 by reactive sputtering in which the proportion of nitrogen gas to argon gas ($Ar:N_2$) was set to 1:9 in volume ratio (the step of forming a metal nitride film that contains fewer dangling bonds). The anti-reflection film 7 and the metal nitride film 71 were formed successively.

Next, the wiring 6, the anti-reflection film 7, and the metal nitride film 71 were patterned as illustrated in FIG. 4 with the use of photolithography and etching to form the wiring layer including the wiring 6, the anti-reflection film 7, and the metal nitride film 71.

The silicon oxide film 3 having a thickness of 2,000 Å was formed next from a $SiO_2$ film on the wiring layer including the wiring 6, the anti-reflection film 7, and the metal nitride film 71 as illustrated in FIG. 5 by plasma CVD so as to cover the wiring layer (the oxide film forming step).

The protection film 4 was formed next from a silicon nitride film on the silicon oxide film 3 as illustrated in FIG. 6 so as to have a thickness of 7,000 Å by plasma CVD (the protection film forming step).

Photolithography and etching were used next to form an opening that penetrated the protection film 4, the silicon oxide film 3, the metal nitride film 71, and the anti-reflection film 7, and exposed the wiring 6 at the bottom (the opening portion forming step), thereby forming the pad portion 8.

Through the steps described above, the semiconductor device 10 of Example 1 illustrated in FIG. 1 was obtained.

Example 2

A semiconductor device 10 of Example 2 was obtained in the same way as in Example 1, except that the following step of forming a metal nitride film that contains fewer dangling bonds was performed in place of the step of forming a metal nitride film that contains fewer dangling bonds in the manufacture of the semiconductor device 10 of Example 1.

In Example 2, a nitridation process was performed on a surface of the anti-reflection film 7 as the step of forming a metal nitride film containing fewer dangling bonds. Heat treatment in which the sample was held in a nitrogen gas atmosphere at 350° C. for one minute was performed as the nitridation process.

Example 3

A semiconductor device of Example 3 which is illustrated in FIG. 9 was obtained by the following manufacturing method.

Steps up through the anti-reflection film forming step were executed in the same way as in Example 1. Next, photolithography and etching were used to pattern the wiring 6 and the anti-reflection film 7 as illustrated in FIG. 10, thereby forming a wiring layer including the wiring 6 and the anti-reflection film 7.

The silicon oxide film 3 and the protection film 4 were formed next in the stated order on the wiring layer including the wiring 6 and the anti-reflection film 7, in the same way as in Example 1.

Photolithography and etching were used next to form an opening that penetrated the protection film 4, the silicon oxide film 3, and the anti-reflection film 7, and exposed the wiring 6 at the bottom (the opening portion forming step), thereby forming the pad portion 8.

Next, the same nitridation process as the nitridation process in the step of forming a metal nitride film that contains fewer dangling bonds in Example 2 was performed on a portion of the anti-reflection film 7 that was exposed in the second opening portion 92, to thereby obtain the semiconductor device 20 of Example 3, which is illustrated in FIG. 9.

Example 4

A semiconductor device 30 of Example 4 which is illustrated in FIG. 14 was obtained by performing, on the semiconductor device 10 of Example 1, the same nitridation process as the nitridation process that was performed in the step of forming a metal nitride film that contains fewer dangling bonds in the manufacture of the semiconductor device 20 of Example 3.

Comparative Example 1

A semiconductor device of Comparative Example 1 was obtained in the same way as in Example 1, except that the step of forming a metal nitride film that contains fewer dangling bonds was not executed.

The thus obtained semiconductor devices of Examples 1 to 4 and Comparative Example 1 were subjected to the following long-term reliability test (THB) involving bias application under a high-temperature and high-humidity environment, and the appearances thereof were evaluated.

"Long-term Reliability Test (THB)"

The semiconductor devices of Examples 1 to 4 and Comparative Example 1 were each packaged into a package to create twenty-two samples for each semiconductor device. A voltage was applied to each sample for 1,000 hours in an environment in which the temperature was 85° C. and the humidity (RH) was 85%. Each package was then opened, and a portion around the pad portion was observed under a microscope to conduct an appearance test by the following criteria.

"Criteria"

Appearance is fine: there is no corrosion, detachment, or discoloration in the pad portion or around the pad portion.

Appearance is defective: corrosion, detachment, or discoloration is found in the pad portion or around the pad portion.

After the long-term reliability test (THB), the numbers of defective appearance samples in the semiconductor devices of Examples 1 to 4 and Comparative Example 1 were as follows. Specifically, the number of defective appearance samples (the number of defective appearance samples/the total number of samples) was 0/22 in Example 1 to Example 4 each, and the number of defective appearance samples (the number of defective appearance samples/the total number of samples) was 3/20 in Comparative Example 1.

As a result of the long-term reliability test (THB), the semiconductor devices of Examples 1 to 4 were found to be higher in reliability than the semiconductor device of Comparative Example 1. The higher reliability is inferred to be the result of the prevention of the oxidation of titanium nitride forming the anti-reflection film by the presence of the metal nitride region containing fewer dangling bonds which was formed in the semiconductor devices of Examples 1 to 4.

Of the semiconductor devices of Examples 1 to 4, the semiconductor device of Example 4 in which a metal nitride region containing fewer dangling bonds than in the anti-reflection film is formed on both of the entire opposed surface of the anti-reflection film 7 which faces the silicon oxide film 3 above the anti-reflection film 7, and the entire exposed surface of the anti-reflection film 7 which is exposed in the second opening portion 92, is considered to be particularly high in reliability, although the semiconductor device of Example 4 is not different from the semiconductor devices of Examples 1 to 3 in this long-term reliability test.

What is claimed is:

1. A method of manufacturing a semiconductor device, comprising:
    forming a wiring on a substrate;
    forming an anti-reflection film from titanium nitride on the wiring by reactive sputtering that uses argon gas and nitrogen gas;
    forming a metal nitride film that contains fewer dangling bonds than in the anti-reflection film on the anti-reflection film by reactive sputtering in which a proportion of nitrogen gas to argon gas is set higher than a proportion of nitrogen gas to argon gas that is used when the anti-reflection film is formed;
    forming a silicon oxide film on the metal nitride film containing fewer dangling bonds than in the anti-reflection film; and
    forming an opening that penetrates the silicon oxide film, the metal nitride film containing fewer dangling bonds than in the anti-reflection film, and the anti-reflection film, and that exposes the wiring at a bottom of the opening.

2. The method of manufacturing a semiconductor device according to claim 1, wherein the step of manufacturing a metal nitride film that contains fewer dangling bonds than in the anti-reflection film includes forming a titanium nitride film by reactive sputtering that uses a target containing titanium.

3. A method of manufacturing a semiconductor device, comprising:
    forming a wiring on a substrate;
    forming an anti-reflection film from titanium nitride on the wiring;
    forming a metal nitride film that contains fewer dangling bonds than in the anti-reflection film by performing a nitridation process on a surface of the anti-reflection film;
    forming a silicon oxide film on the metal nitride film containing fewer dangling bonds than in the anti-reflection film; and
    forming an opening that penetrates the silicon oxide film, the metal nitride film containing fewer dangling bonds than in the anti-reflection film, and the anti-reflection film, and that exposes the wiring at a bottom of opening.

4. The method of manufacturing a semiconductor device according to claim 3, wherein the nitridation process is one of heat treatment in a nitrogen-containing gas atmosphere and plasma treatment that uses a nitrogen-containing gas.

5. The method of manufacturing a semiconductor device according to claim 1, further comprising a protection film forming step of forming a protection film from a silicon nitride film on the silicon oxide film after the oxide film forming step,
    wherein the opening portion forming step includes forming the opening that penetrates the protection film and exposes the wiring at the bottom.

6. The method of manufacturing a semiconductor device according to claim 2, further comprising a protection film forming step of forming a protection film from a silicon nitride film on the silicon oxide film after the oxide film forming step,
    wherein the opening portion forming step includes forming the opening that penetrates the protection film and exposes the wiring at the bottom.

7. The method of manufacturing a semiconductor device according to claim 3, further comprising a protection film forming step of forming a protection film from a silicon nitride film on the silicon oxide film after the oxide film forming step,
    wherein the opening portion forming step includes forming the opening that penetrates the protection film and exposes the wiring at the bottom.

* * * * *